(12) United States Patent
Jung et al.

(10) Patent No.: US 11,264,256 B2
(45) Date of Patent: Mar. 1, 2022

(54) WAFER INSPECTION APPARATUS

(71) Applicant: SAMSUNG ELECTRONICS CO., LTD., Suwon-si (KR)

(72) Inventors: Jaehwang Jung, Hwaseong-si (KR); Gwangsik Park, Hwaseong-si (KR); Wookrae Kim, Suwon-si (KR); Juntaek Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 182 days.

(21) Appl. No.: 16/849,631

(22) Filed: Apr. 15, 2020

(65) Prior Publication Data
US 2021/0082725 A1    Mar. 18, 2021

(30) Foreign Application Priority Data
Sep. 17, 2019 (KR) .................. 10-2019-0113968

(51) Int. Cl.
*G01N 21/21* (2006.01)
*H01L 21/67* (2006.01)
(Continued)

(52) U.S. Cl.
CPC ....... *H01L 21/67288* (2013.01); *G01N 21/21* (2013.01); *G01N 21/255* (2013.01);
(Continued)

(58) Field of Classification Search
CPC ... H01L 21/67288; H01L 22/12; H01L 22/30; G01N 21/21; G01N 21/255; G01N 21/27;
(Continued)

(56) References Cited

U.S. PATENT DOCUMENTS 6,469,793 B1    10/2002 Stanton
8,837,045 B2    9/2014 Popescu et al.
(Continued)

FOREIGN PATENT DOCUMENTS

KR    10-0531693 B1    11/2005
KR    10-0577107 B1    5/2006
(Continued)

*Primary Examiner* — Roy M Punnoose
(74) *Attorney, Agent, or Firm* — Sughrue Mion, PLLC

(57) ABSTRACT

Provided is a wafer inspection apparatus including a monochromator that extracts monochromatic light, a collimator that outputs the monochromatic light as parallel light, a first polarization assembly that polarizes the parallel light and radiates the polarized light to a wafer, an imaging optical system that condenses light reflected from the wafer, a spectroscope that splits the condensed light into a plurality of spectrums, a first lens that condenses the plurality of spectrums, a second polarization assembly that outputs the plurality of spectrums as a plurality of polarized lights having different diffraction orders and a difference of 90°, a second lens that condenses the plurality of polarized lights, a third polarization assembly that outputs common polarized light based on the plurality of polarized interfering with each other, a camera that generates a phase difference image based on the common polarized light, and a signal processor that analyzes the phase difference image.

20 Claims, 13 Drawing Sheets

(51) Int. Cl.

| | |
|---|---|
| *G02B 27/28* | (2006.01) |
| *G02B 27/42* | (2006.01) |
| *G02B 27/30* | (2006.01) |
| *G01N 21/25* | (2006.01) |
| *G01N 21/27* | (2006.01) |
| *G01N 21/88* | (2006.01) |
| *G01N 21/95* | (2006.01) |
| *G02B 27/10* | (2006.01) |
| *G06T 7/00* | (2017.01) |
| *G01N 21/17* | (2006.01) |

(52) U.S. Cl.
CPC ......... *G01N 21/27* (2013.01); *G01N 21/8806* (2013.01); *G01N 21/9501* (2013.01); *G02B 27/1093* (2013.01); *G02B 27/286* (2013.01); *G02B 27/30* (2013.01); *G02B 27/4205* (2013.01); *G06T 7/0004* (2013.01); *G01N 2021/1765* (2013.01); *G01N 2021/8848* (2013.01); *G01N 2201/0633* (2013.01)

(58) Field of Classification Search
CPC ........... G01N 21/8806; G01N 21/9501; G01N 2021/1765; G01N 2021/8848; G01N 2201/0633; G01N 21/956; G01N 21/211; G02B 27/1093; G02B 27/286; G02B 27/30; G02B 27/4205; G06T 7/0004; G06T 2207/30148
USPC ......................................................... 382/149
See application file for complete search history.

(56) References Cited

U.S. PATENT DOCUMENTS

| | | | |
|---|---|---|---|
| 9,074,861 | B2 | 7/2015 | Tamiya |
| 10,168,621 | B2 | 1/2019 | Dekkers et al. |
| 11,067,389 | B2 * | 7/2021 | Chuang ............... G03F 7/70633 |
| 2002/0033945 | A1 | 3/2002 | Xu et al. |
| 2004/0042009 | A1 | 3/2004 | Aspnes et al. |
| 2006/0280106 | A1 | 12/2006 | 'T Hooft et al. |
| 2019/0212255 | A1 * | 7/2019 | Neil ....................... G01J 3/0202 |
| 2019/0285407 | A1 * | 9/2019 | Chuang ............... G03F 7/70625 |

FOREIGN PATENT DOCUMENTS

| | | |
|---|---|---|
| KR | 10-2006-0064647 A | 6/2006 |
| KR | 10-2017-0091656 A | 8/2017 |
| KR | 10-1930777 B1 | 12/2018 |

* cited by examiner

WAFER INSPECTION APPARATUS

CROSS-REFERENCE TO RELATED APPLICATION

This application claims priority to Korean Patent Application No. 10-2019-0113968, filed on Sep. 17, 2019 in the Korean Intellectual Property Office, the entire contents of which is incorporated by reference herein their entirely.

BACKGROUND

1. Field

Example embodiments of the disclosure relate to a wafer inspection apparatus being configured to inspect a wafer by acquiring a phase difference image between different polarized lights through a single measurement and methods of inspecting the wager using the wafer inspection apparatus.

2. Description of Related Art

In a semiconductor manufacturing process, design processes to shrink the semiconductor structure has been continuously developed. As a result, the size of a semiconductor structure has decreased, and defects have been variously distributed. High sensitivity and distribution information are required in order to measure micro-scale patterns formed on a wafer. In addition, it is necessary to secure locality in defect detection when inspecting the wafer.

SUMMARY

One or more example embodiments provide a wafer inspection apparatus and wafer inspection method capable of acquiring a phase difference image between different polarized lights through a single measurement, whereby it is possible to inspect a wafer without reduction in speed.

One or more example embodiments also provide a wafer inspection apparatus and wafer inspection method capable of acquiring a phase difference image between different polarized lights through a single measurement, whereby it is possible to improve sensitivity in defect detection.

One or more example embodiments also provide a wafer inspection apparatus and wafer inspection method capable of acquiring a phase difference image between different polarized lights through a single measurement, whereby it is possible to secure locality in defect detection.

According to an aspect of an example embodiment, there is provided a wafer inspection apparatus including a monochromator configured to extract monochromatic light from light received from a light source, a collimator configured to output the monochromatic light received from the monochromator as parallel light, a first polarization assembly configured to polarize light output from the collimator and to radiate the polarized light to a wafer, an imaging optical system configured to condense light reflected from the wafer, a spectroscope configured to split the condensed light output from the imaging optical system into a plurality of spectrums respectively having different diffraction orders, a first lens configured to condense the plurality of spectrums respectively having different diffraction orders, a second polarization assembly configured to output the plurality of spectrums having different diffraction orders as a plurality of polarized lights having different diffraction orders and a difference of 90°, a second lens configured to condense the plurality of polarized lights having the different diffraction orders and the difference of 90°, a third polarization assembly configured to output common polarized light based on the plurality of polarized lights having the different diffraction orders interfering with each other, a camera configured to generate a phase difference image based on the common polarized light, and a signal processor configured to analyze the phase difference image.

According to another aspect of an example embodiment, there is provided a wafer inspection apparatus including a monochromator configured to extract monochromatic light from light received from a light source, a collimator configured to output the monochromatic light received from the monochromator as parallel light, a first polarization assembly configured to polarize light output from the collimator and to radiate the polarized light to a wafer, an imaging optical system configured to condense light reflected from the wafer, a spectroscope configured to split the condensed light output from the imaging optical system into a plurality of spectrums respectively having different diffraction orders, a first lens configured to condense the plurality of spectrums having the different diffraction orders, a second polarization assembly configured to output two spectrums, among the plurality of spectrums having the different diffraction orders, as a plurality of polarized lights having different diffraction orders and a difference of 90°, an optical shutter configured to selectively output the plurality of polarized lights having different diffraction orders and the difference of 90° and non-polarized light, a second lens configured to condense the plurality of polarized lights output from the optical shutter, a third polarization assembly configured to output common polarized light based on the plurality of polarized lights interfering with each other, a camera configured to generate a phase difference image based on the common polarized light, and a signal processor configured to analyze the phase difference image.

According to yet another aspect of an example embodiment, there is provided a wafer inspection apparatus including a monochromator configured to extract monochromatic light from light received from a light source, a collimator configured to output the monochromatic light received from the monochromator as parallel light, a first polarization assembly configured to polarize light output from the collimator and to radiate the polarized light to a wafer, an imaging optical system configured to condense light reflected from a test piece of the wafer, a spectroscope configured to split the condensed light output from the imaging optical system into a plurality of spectrums respectively having different diffraction orders, a first lens configured to condense the plurality of spectrums having different diffraction orders, a rotator configured to change a position of the spectroscope, a second polarization assembly configured to output the plurality of spectrums having different diffraction orders as a plurality of polarized lights having different diffraction orders and a difference of 90°, a second lens configured to condense the plurality of polarized lights having different diffraction orders and the difference of 90°, a third polarization assembly configured to output common polarized light based on the plurality of polarized lights having different diffraction orders interfering with each other, a camera configured to generate a phase difference image based on the common polarized light, and a signal processor configured to analyze the phase difference image.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION

Figure 1:
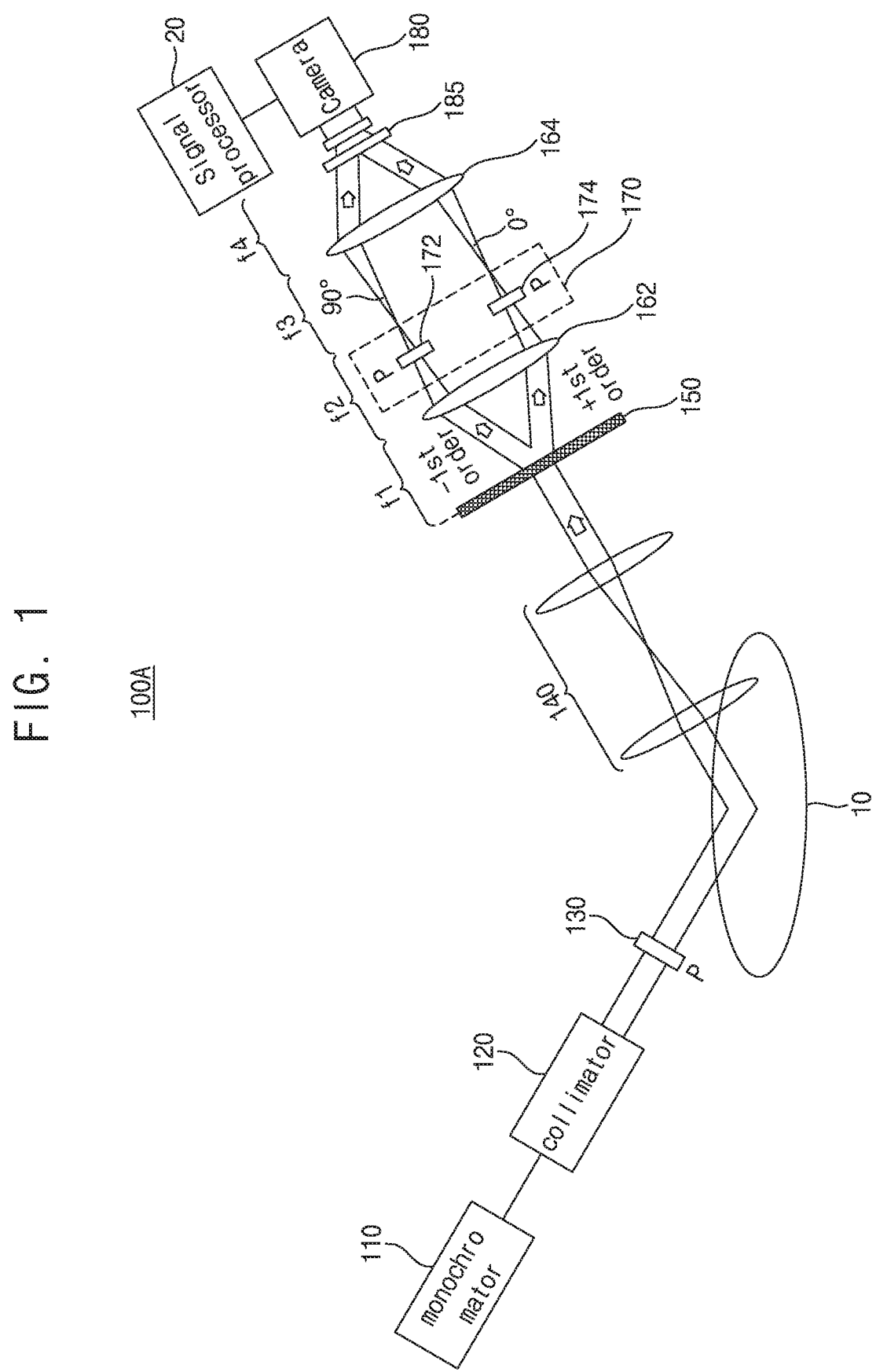
FIG. 1 illustrates a wafer inspection apparatus in accordance with an example embodiment.

FIG. 1 illustrates a wafer inspection apparatus 100A in accordance with an example embodiment.

Referring to FIG. 1, the wafer inspection apparatus 100A may include a monochromator 110, a collimator 120, a first polarization assembly 130, an imaging optical system 140, a spectroscope 150, a first lens 162, a second lens 164, a second polarization assembly 170, a camera 180, a third polarization assembly 185, and a signal processor 20. The second polarization assembly 170 may include a first polarizer 172 and a second polarizer 174.

The monochromator 110 may extract monochromatic light from light incident from a light source. For example, the monochromator 110 may include an ultraviolet-visible spectrometer. The monochromator 110 may be disposed between the light source and the collimator 120. Light output from the light source may not be suitable for inspecting a wafer 10, since the light includes various colors of light in a mixed state. Monochromatic light for inspecting the wafer 10 may be extracted using the monochromator 110, and may be output to the collimator 120.

The collimator 120 may include at least one curved mirror or lens, and may be disposed between the monochromator 110 and the first polarization assembly 130. The collimator 120 may output the monochromatic light incident from the monochromator 110 as parallel light. Light may not be used to inspect the wafer 10 without being converted, since the light has a radiation property. Consequently, parallel light is necessary to inspect the wafer 10. The collimator 120 may generate parallel light through an object lens such that the light does not spread, and may output the generated parallel light to the first polarization assembly 130.

Figure 2A:
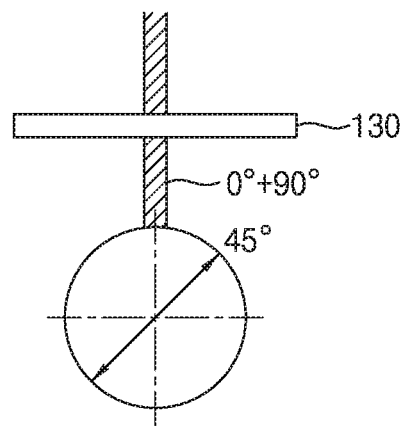
FIG. 2A illustrates polarization by the first polarization unit shown in FIG. 1.

FIG. 2A illustrates polarization by the first polarization assembly 130 shown in FIG. 1.

Referring to FIGS. 1 and 2A, the first polarization assembly 130 may be disposed between the collimator 120 and the wafer 10. The first polarization assembly 130 may polarize light incident from the collimator 120, and may output the polarized light to the wafer 10.

The first polarization assembly 130 may output polarized light having a first angle from the incident light. In an example embodiment, the first polarization assembly 130 may output polarized lights between 0° and 90°. For example, 45° polarized light may be radiated on the upper surface of the wafer 10.

Light reflected from a test piece of the wafer 10 may be incident on the imaging optical system 140. The imaging optical system 140 may be disposed between the wafer 10 and the spectroscope 150. The imaging optical system 140 may include a plurality of lenses, and may condense light reflected from the wafer 10 and output the light to the spectroscope 150.

The spectroscope 150 may be disposed between the imaging optical system 140 and the first lens 162. The spectroscope 150 may be disposed at a position at which light is focused, for example, an image is formed, by the imaging optical system 140. A plurality of arbitrary diffraction orders may be applied to the spectroscope 150, and the spectroscope 150 may output incident light as a plurality of spectrums having different diffraction orders. FIG. 1 shows that the spectroscope 150 outputs spectrums having two diffraction orders, as an example.

Figure 3A:
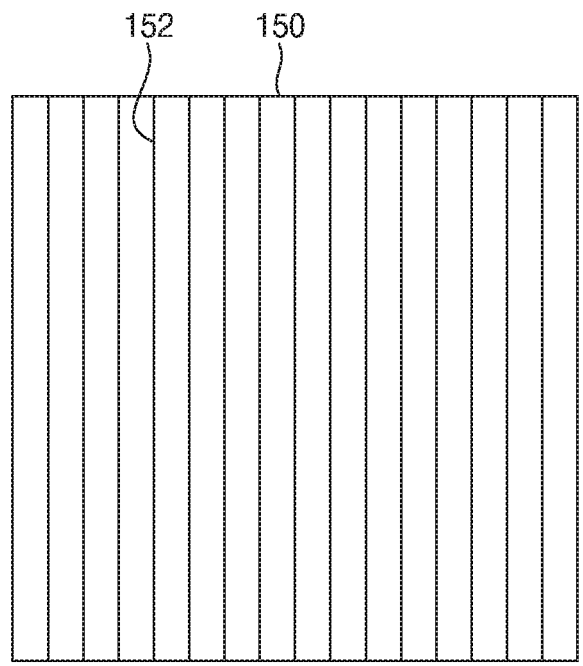
FIG. 3A illustrates the spectroscope shown in FIG. 1 including a one-dimensional (1D) grating.
Figure 3B:
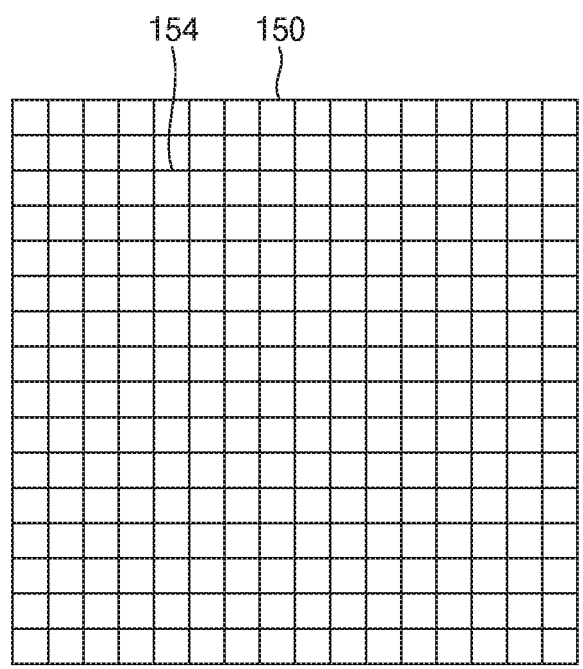
FIG. 3B illustrates the spectroscope shown in FIG. 1 including a two-dimensional (2D) grating.

FIG. 3A illustrates that the spectroscope 150 shown in FIG. 1 includes a one-dimensional (1D) grating 152. FIG. 3B illustrates that the spectroscope 150 shown in FIG. 1 includes a two-dimensional (2D) grating 154.

As shown in FIG. 3A, the spectroscope 150 may include a one-dimensional (1D) grating 152 that is uniformly disposed. As shown in FIG. 3B, the spectroscope 150 may include a two-dimensional (2D) grating 154 that is uniformly disposed.

A plurality of spectrums, for example, two spectrums, having different diffraction orders, for example, −1st order and +1st order, may be output by the one-dimensional grating 152 or the two-dimensional grating 154 included in the spectroscope 150. As an example, the one-dimensional grating 152 or the two-dimensional grating 154 may include saw-toothed grooves. Incident light may be dispersed, and light having a specific wavelength may be output, using the grooves of the grating 154.

The first lens 162 may be disposed between the spectroscope 150 and the second polarization assembly 170. The second lens 164 may be disposed between the second polarization assembly 170 and the third polarization assembly 185. The second polarization assembly 170 may be disposed between the first lens 162 and the second lens 164. The third polarization assembly 185 may be disposed between the second lens 164 and the camera 180.

A plurality of spectrums, for example, two spectrums, output from the spectroscope 150 may be focused on a specific point using the first lens 162 and the second lens 164. The first lens 162 may condense a plurality of spectrums, for example, two spectrums, output from the spectroscope 150 on the first polarizer 172 and the second polarizer 174. That is, a plurality of spectrums, for example, two spectrums, may be incident on the first polarizer 172 and the second polarizer 174 as parallel lights without radiating by the first lens 162. The second lens 164 may condense first polarized light output from the first polarizer 172 and second polarized light output from the second polarizer 174 on the third polarization assembly 185 to output common polarized light.

A first distance f1 from the spectroscope 150 to the first lens 162 and a second distance f2 from the first lens 162 to a point on which light output from the first lens 162 is focused may be equal to each other (f1=f2). In addition, a third distance f3 from a point on which light is focused to the second lens 164 and a fourth distance f4 from the second lens 164 to the camera 180 may be equal to each other (f3=f4).

Figure 2B:
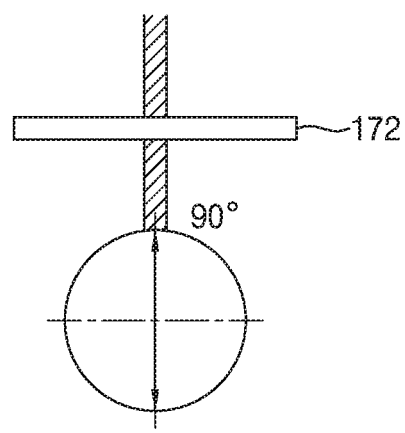
FIG. 2B illustrates polarization by the first polarizer of the second polarization unit shown in FIG. 1.
Figure 2C:
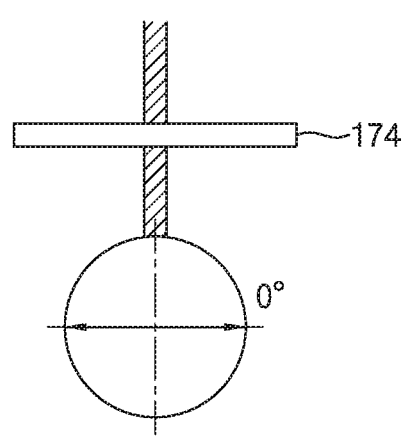
FIG. 2C illustrates polarization by the second polarizer of the second polarization unit shown in FIG. 1.

FIG. 2B illustrates polarization by the first polarizer 172 of the second polarization assembly 170 shown in FIG. 1. FIG. 2C illustrates polarization by the second polarizer 174 of the second polarization assembly 170 shown in FIG. 1.

Referring to FIGS. 1, 2B, and 2C, the first polarizer 172 and the second polarizer 174 of the second polarization assembly 170 may output polarized lights having a difference of 90°. For example, the first polarizer 172 may perform first polarization that is a 90° polarization with respect to a spectrum having a first diffraction order (−1st order) incident from the first lens 162, and may output 90° polarized light having a first diffraction order (−1st order) to the second lens 164. The second polarizer 174 may perform second polarization that is a 0° polarization with respect to a spectrum having a second diffraction order (+1st order) incident from the first lens 162, and may output 0° polarized light having a second diffraction order (+1st order) to the second lens 164.

The third polarization assembly 185 may be disposed at a position at which two spectrums output from the second lens 164 are focused. Two perpendicularly polarized lights, the 90° polarized light and the 0° polarized light, may be focused through the second lens 164, and first polarized light and second polarized light may be incident on the third polarization assembly 185. For example, common polarized light, for example, a 45° polarized light resulting from a combination of the first polarized light that is the 90° polarized light and the second polarized light that is the 0° polarized light may be incident on the camera 180.

First polarized light and second polarized light may be incident to the third polarization assembly 185. The first polarized light and the second polarized light may not interfere with each other, but may be output as common polarized light such that interference between the first polarized light and the second polarized light is caused by the third polarization assembly 185. The third polarization assembly 185 may cause interference between the first polarized light and the second polarized light. Since the 90° polarized light is output from the first polarizer 172 and the 0° polarized light is output from the second polarizer 174, a 45° polarizing plate may be applied to the third polarization assembly 185 such that the two polarized lights may interfere with each other. The third polarization assembly 185 may output 45° common polarized light such that the first polarized light that is the 90° polarized light and the second polarized light that is the 0° polarized light incident thereon interfere with each other. However, embodiments are not limited thereto. In an example embodiment, the third polarization assembly 185 may output any one of 15° to 30° common polarized lights or any one of 60° to 75° common polarized lights.

The camera 180 may generate a test piece image having an interference pattern based on the common polarized light incident thereon from the third polarization assembly 185. The camera 180 may output the generated test piece image having the interference pattern to the signal processor 20. The test piece image having the interference pattern may be a phase difference image due to the first polarized light that is the 90° polarized light and the second polarized light that is the 0° polarized light. The signal processor 20 may analyze the test piece images having interference patterns on the entire region of the wafer 10, and may output the result of analysis.

A general spectral reflectometry (SR) method has a disadvantage in that sensitivity in defect detection is relatively low. Since the spectral reflectometry (SR) method performs measurement on a single point, it is not possible to secure locality in defect detection.

A general spectral ellipsometry (SE) method measures intensity and phase information of light based on polarization. The spectral ellipsometry (SE) method has higher sensitivity in defect detection than the spectral reflectometry (SR) method, however, it is not possible to secure locality in defect detection.

An imaging spectral ellipsometry (imaging SE) method, in which a phase information measurement process is added to a general imaging spectral reflectometry (imaging SR) method, may be used. In the spectral ellipsometry (imaging SE) method, it is possible to secure both sensitivity and locality in defect detection. In the spectral ellipsometry (imaging SE) method, however, signals must be measured while polarization is changed several times in order to acquire phase information, whereby inspection time increases.

In the wafer inspection apparatus 100A according to the example embodiment and a wafer inspection method using the same, it is possible to generate first polarized light that is the 90° polarized light and second polarized light that is the 0° polarized light through a single measurement, for example, a single-shot. It is possible to generate test piece images having interference patterns on the entire region of the wafer 10 using common polarized light, due to which the first polarized light that is the 90° polarized light and the second polarized light that is the 0° polarized light interfere with each other. As a result, it is possible to secure relatively high sensitivity and locality in defect detection through a single measurement, whereby it is possible to analyze whether patterns have been accurately formed on the wafer 10. In addition, it is possible to inspect the wafer 10 through a single measurement, thereby reducing inspection time.

Figure 4:
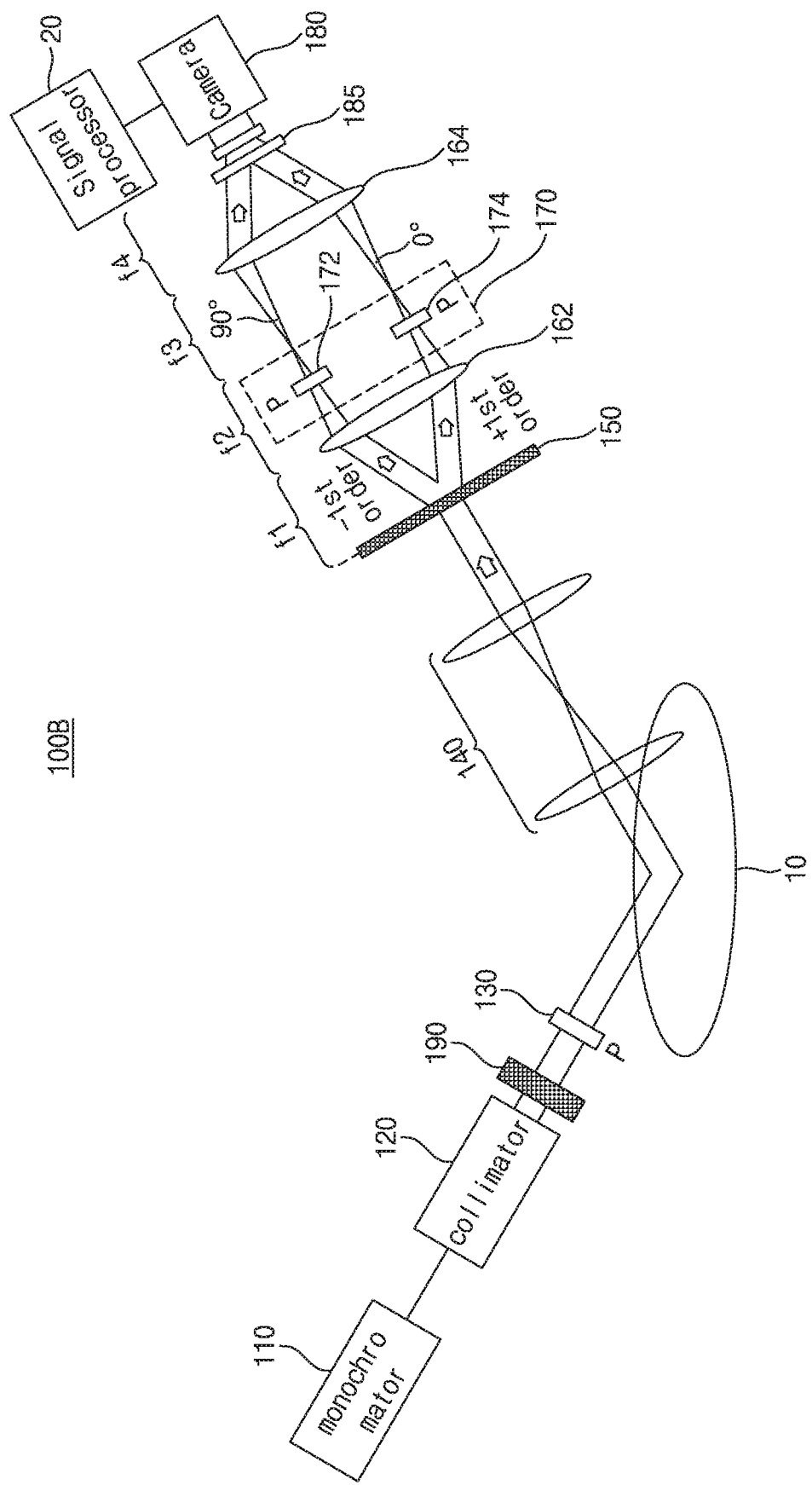
FIGS. 4 and 5 illustrate wafer inspection apparatuses in accordance with example embodiments.

FIG. 4 illustrates a wafer inspection apparatus 100B in accordance with another example embodiment of the present disclosure. In describing the wafer inspection apparatus 100B shown in FIG. 4, a description of components identical to those of the wafer inspection apparatus 100A shown in FIG. 1 may be omitted.

Referring to FIG. 4, the wafer inspection apparatus 100B may include a monochromator 110, a collimator 120, a first polarization assembly 130, an imaging optical system 140, a spectroscope 150, a first lens 162, a second lens 164, a second polarization assembly 170, a camera 180, a third polarization assembly 185, a signal processor 20, and a reference light signal generator 190.

The third polarization assembly 185 may be disposed between the second lens 164 and the camera 180. The second lens 164 may condense first polarized light output from the first polarizer 172 and second polarized light output from the second polarizer 174 to the third polarization assembly 185 to output common polarized light. The third polarization assembly 185 may be disposed at a position at which two spectrums output from the second lens 164 are focused. Two perpendicularly polarized lights, for example, a 90° polarized light and a 0° polarized light may be focused through the second lens 164, and first polarized light and second polarized light may be incident on the third polarization assembly 185. That is, common polarized light, for example, 45° polarized light resulting from a combination of the first polarized light that is a 90° polarized light and the second polarized light that is a 0° polarized light may be incident on the camera 180.

First polarized light and second polarized light may be incident on the third polarization assembly 185. The third polarization assembly 185 may cause common polarized light by interference between the first polarized light and the second polarized light For example, the third polarization assembly 185 may output 45° common polarized light such that the first polarized light that is a 90° polarized light and the second polarized light that is a 0° polarized light incident thereon interfere with each other. However, embodiments are not limited thereto. In an embodiment, the third polarization assembly 185 may output any one of 15° to 30° common polarized lights or any one of 60° to 75° common polarized lights.

The reference light signal generator 190, which is configured to provide properties of source light radiated to the wafer 10 to the signal processor 20, may include a beam splitter configured to split the source light. The reference light signal generator 190 may be disposed between the collimator 120 and the first polarization assembly 130. However, embodiments are not limited thereto. In an example embodiment, the reference light signal generator 190 may be disposed between the first polarization assembly 130 and the wafer 10.

The reference light signal generator 190 may generate a reference light signal in order to improve accuracy in analysis when the signal processor 20 analyzes a test piece image having an interference pattern. For example, the reference light signal generator 190 may split source light before the source light is radiated to the wafer 10, and may analyze reference light split from the source light in order to generate a reference light signal. The reference light signal may be output to the signal processor 20. The signal processor 20 may analyze test piece images having interference patterns on the entire region of the wafer 10 based on the reference light signal, and may output the result of analysis.

In the wafer inspection apparatus 100B according to an example embodiment and a wafer inspection method using the same, it is possible to secure relatively high sensitivity and locality in defect detection through a single measurement, whereby it is possible to analyze whether patterns have been accurately formed on the wafer 10. In addition, it is possible to inspect the wafer 10 through a single measurement, thereby reducing inspection time.

Figure 5:
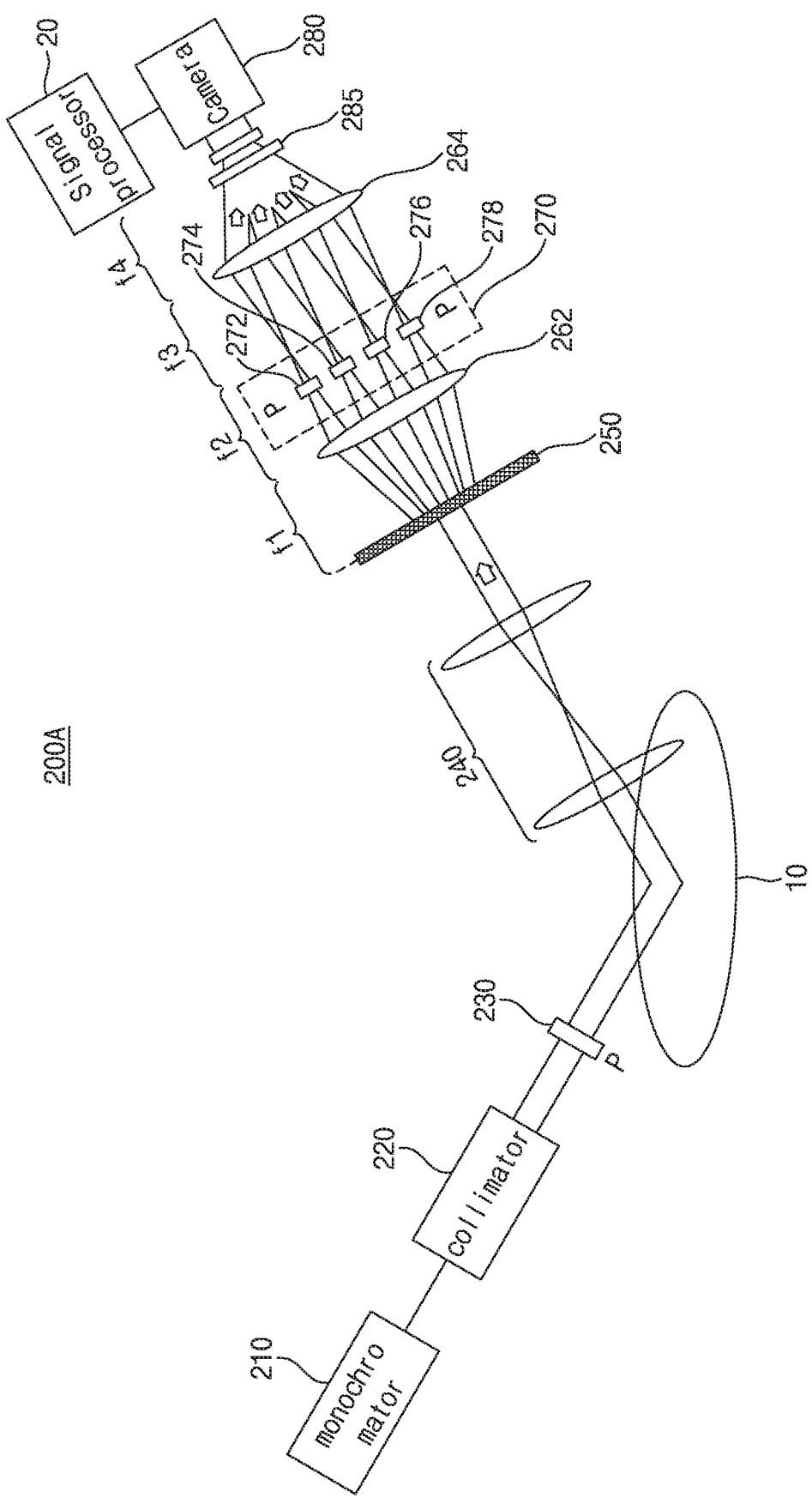

FIG. 5 illustrates a wafer inspection apparatus 200A in accordance with another example embodiment. In describing the wafer inspection apparatus 200A shown in FIG. 5, a description of components identical to those of the wafer inspection apparatus 100A shown in FIG. 1 may be omitted.

Referring to FIG. 5, the wafer inspection apparatus 200A may include a monochromator 210, a collimator 220, a first polarization assembly 230, an imaging optical system 240, a spectroscope 250, a first lens 262, a second lens 264, a second polarization assembly 270, a camera 280, a third polarization assembly 285, and a signal processor 20.

A plurality of arbitrary diffraction orders may be applied to the spectroscope 250, and the spectroscope 250 may output incident light as a plurality of spectrums having different diffraction orders. FIG. 5 shows that the spectroscope 250 outputs spectrums having four diffraction orders as an example.

Four spectrums having different diffraction orders, for example −1st order, 1st order, 2nd order, and 3rd order, may be output by a one-dimensional grating or a two-dimensional grating formed at the spectroscope 250.

The second polarization assembly 270 may be disposed between the first lens 262 and the second lens 264. The second polarization assembly 270 may include a plurality of polarizers. As an example, the second polarization assembly 270 may include a first polarizer 272, a second polarizer 274, a third polarizer 276, and a fourth polarizer 278.

Figure 6A:
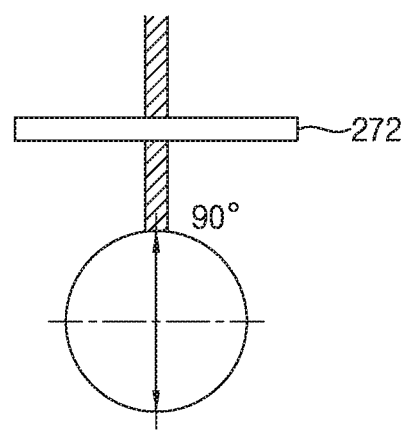
FIG. 6A illustrates polarization by the first polarizer of the second polarization unit shown in FIG. 5.
Figure 6B:
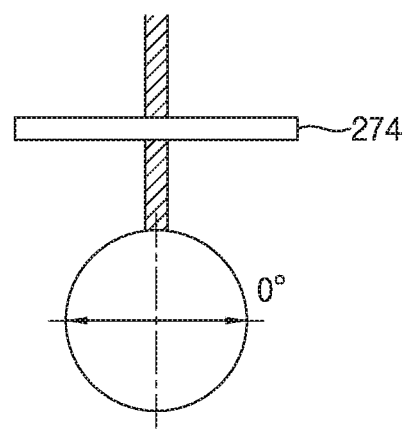
FIG. 6B illustrates polarization by the second polarizer of the second polarization unit shown in FIG. 5.
Figure 6C:
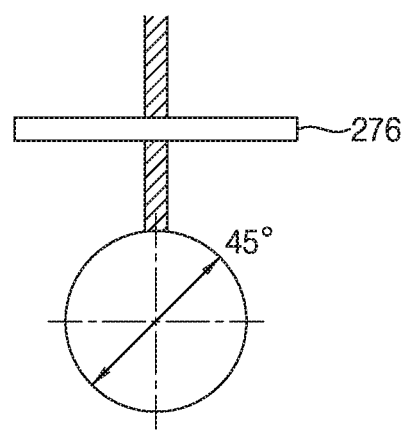
FIG. 6C illustrates polarization by the third polarizer of the second polarization unit shown in FIG. 5.
Figure 6D:
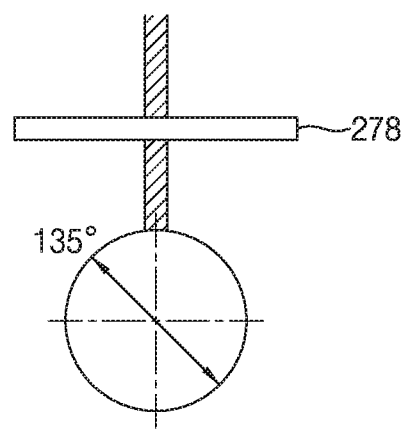
FIG. 6D illustrates polarization by the fourth polarizer of the second polarization unit shown in FIG. 5.

FIG. 6A illustrates polarization by the first polarizer 272 of the second polarization assembly 270 shown in FIG. 5. FIG. 6B illustrates polarization by the second polarizer 274 of the second polarization assembly 270 shown in FIG. 5. FIG. 6C illustrates polarization by the third polarizer 276 of the second polarization assembly 270 shown in FIG. 5. FIG. 6D illustrates polarization by the fourth polarizer 278 of the second polarization assembly 270 shown in FIG. 5.

Referring to FIGS. 5 and 5A to 6D, the first polarizer 272 and the second polarizer 274 may output polarized lights having a difference of 90°. The third polarizer 276 and the fourth polarizer 278 may output polarized lights having a difference of 90°.

As an example, the first polarizer 272 may perform first polarization that is a 90° polarization with respect to a spectrum having a first diffraction order (−1st order) incident from the first lens 262, and may output 90° polarized light having a first diffraction order (−1st order) to the second lens 264.

As an example, the second polarizer 274 may perform second polarization that is a 0° polarization with respect to a spectrum having a second diffraction order (+1st order) incident from the first lens 262, and may output 0° polarized light having a second diffraction order (+1st order) to the second lens 264.

As an example, the third polarizer 276 may perform third polarization that is a 45° polarization with respect to a spectrum having a third diffraction order (2nd order) incident from the first lens 262, and may output 45° polarized light having a third diffraction order (2nd order) to the second lens 264.

As an example, the fourth polarizer 278 may perform fourth polarization that is a 135° polarization with respect to a spectrum having a fourth diffraction order (3rd order) incident from the first lens 262, and may output 135° polarized light having a fourth diffraction order (3rd order) to the second lens 264.

First polarized light that is a 90° polarized light, second polarized light that is a 0° polarized light, third polarized light that is a 45° polarized light, and fourth polarized light that is a 135° polarized light may be focused at a predetermined distance through the second lens 264. The second lens 264 may condense the first polarized light output from the first polarizer 272, the second polarized light output from the second polarizer 274, the third polarized light output from the third polarizer 276, and the first polarized light output from the fourth polarizer 278 on the third polarization assembly 285 to output common polarized light.

The third polarization assembly 285 may be disposed at a position at which the four spectrums output from the second lens 264 are focused. Two pairs of perpendicularly polarized lights, a 90° polarized light and a 0° polarized light, and a 45° polarized light and a 135° polarized light, may be focused through the second lens 264, and the first to fourth polarized lights may be incident on the third polarization assembly 285. Common polarized light, for example, 45° polarized light, which causes interference between the first to fourth polarized lights, may be incident on the camera 280.

Common polarized light may be output such that interference between the first to fourth polarized lights is caused by the third polarization assembly 285. Interference between the first to fourth polarized lights may be caused by the third polarization assembly 285. Since the 90° polarized light is output from the first polarizer 272, the 0° polarized light is output from the second polarizer 274, the 45° polarized light is output from the third polarizer 276, and the 135° polarized light is output from the fourth polarizer 278, a polarizing plate having an angle of any one of 15°, 20°, 25°, 30°, 60°, 65°, 70°, 75°, 105°, 110°, 115°, 120°, 150°, 155°, 160°, and 165° may be applied to the third polarization assembly 285 such that the first to fourth polarized lights interfere with each other. The third polarization assembly 285 may output common polarized light having an angle of any one of 15°, 20°, 25°, 30°, 60°, 65°, 70°, 75°, 105°, 110°, 115°, 120°, 150°, 155°, 160°, and 165° such that the first to fourth polarized lights interfere with each other. However, embodiments are not limited thereto. In an example embodiment, the third polarization assembly 285 may output any one of 60° to 75° common polarized lights, any one of 15° to 30° common polarized lights, any one of 105° to 120° common polarized lights, or any one of 150° to 165° common polarized lights such that the first to fourth polarized lights interfere with each other.

The camera 280 may generate a test piece image having an interference pattern based on the common polarized light incident thereon. The camera 280 may output the generated test piece image having the interference pattern to the signal processor 20. The signal processor 20 may analyze test piece images having interference patterns on the entire region of the wafer 10, and may output the result of analysis.

In the wafer inspection apparatus 200A according to an example embodiment and a wafer inspection method using the same, it is possible to secure relatively high sensitivity and locality in defect detection through a single measurement, whereby it is possible to analyze whether patterns have been accurately formed on the wafer 10. In addition, it is possible to inspect the wafer 10 through a single measurement, thereby reducing inspection time.

Figure 7:
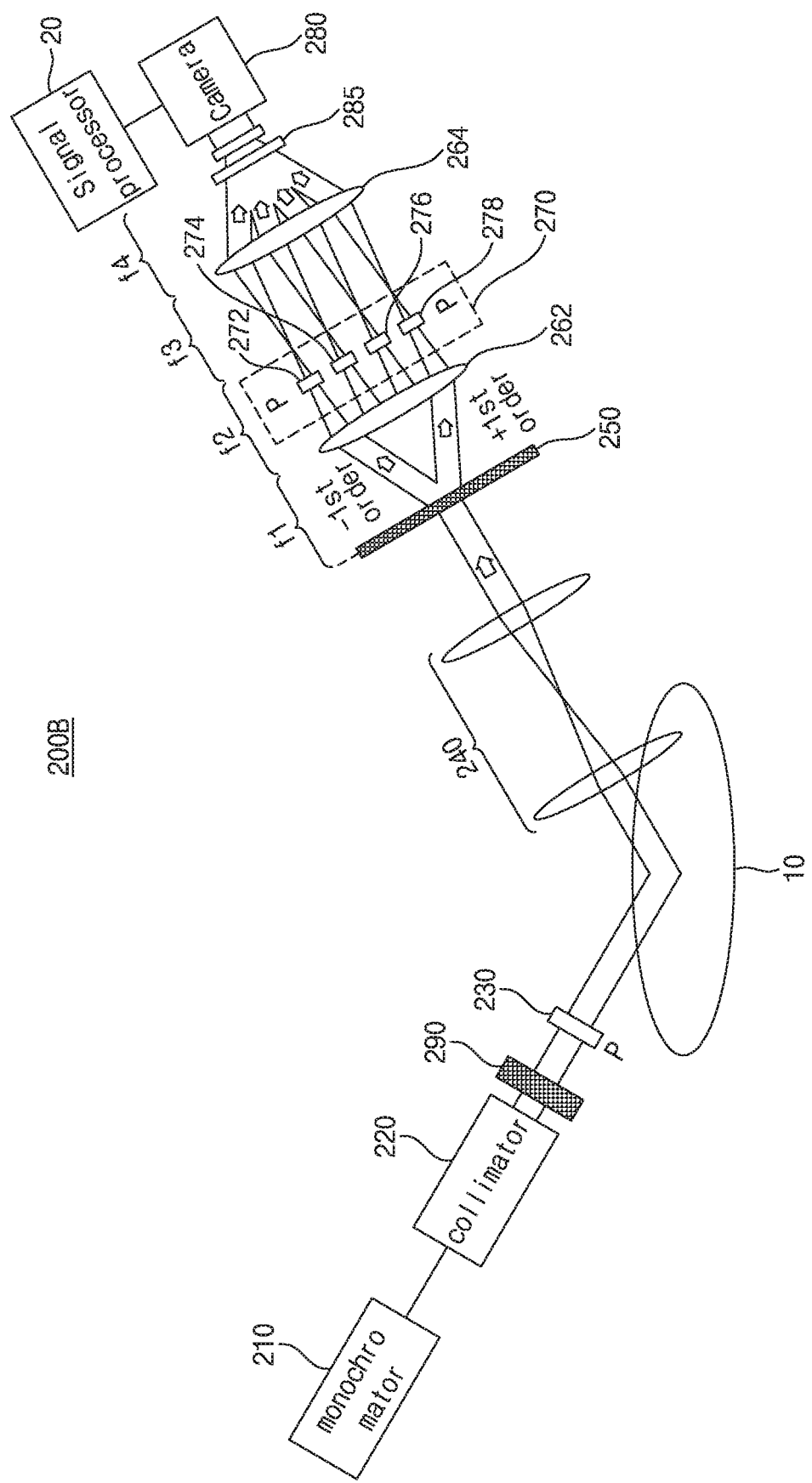
FIGS. 7 and 8 illustrate wafer inspection apparatuses in accordance with example embodiments.

FIG. 7 illustrates a wafer inspection apparatus 200B in accordance with another example embodiment. In describing the wafer inspection apparatus 200B shown in FIG. 7, a description of components identical to those of the wafer inspection apparatus 200A shown in FIG. 6 may be omitted.

Referring to FIG. 7, the wafer inspection apparatus 200B may further include a reference light signal generator 290. The reference light signal generator 290, which is configured to provide properties of source light radiated to the wafer 10 to the signal processor 20, may include a beam splitter. The reference light signal generator 190 may be disposed between the collimator 120 and the first polarization assembly 230. However, embodiments are not limited thereto. In an example embodiment, the reference light signal generator 290 may be disposed between the first polarization assembly 230 and the wafer 10.

The reference light signal generator 290 may split source light before the source light is radiated to the wafer 10, and may analyze reference light split from the source light in order to generate a reference light signal. The reference light signal may be output to the signal processor 20. The signal processor 20 may analyze test piece images having interference patterns on the entire region of the wafer 10 based on the reference light signal, and may output the result of analysis.

Figure 8:
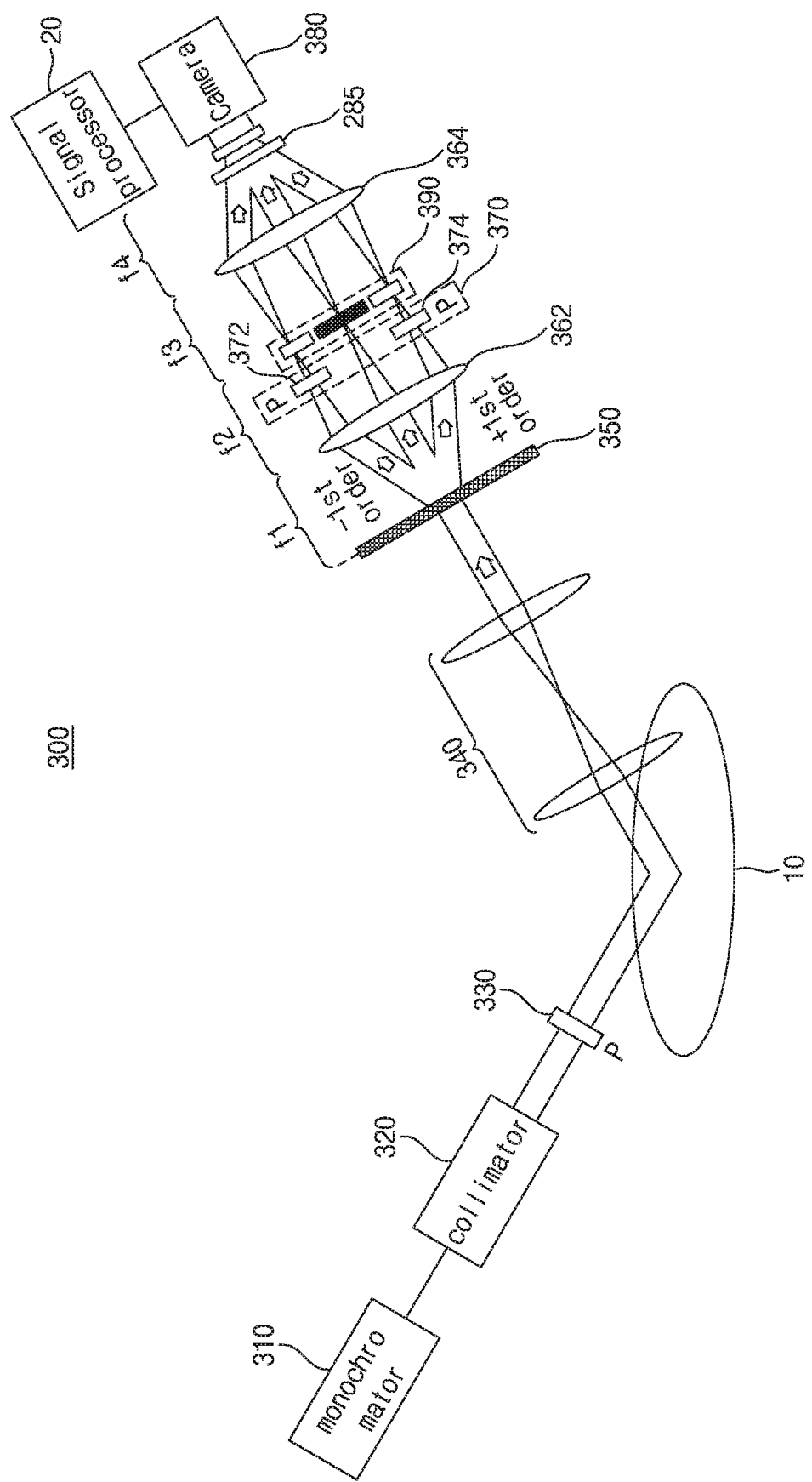

FIG. 8 illustrates a wafer inspection apparatus 300 in accordance with another example embodiment. In describing the wafer inspection apparatus 300 shown in FIG. 8, a description of components identical to those of the wafer inspection apparatus 100A shown in FIG. 1 may be omitted.

Referring to FIG. 8, the wafer inspection apparatus 300 may include a monochromator 310, a collimator 320, a first polarization assembly 330, an imaging optical system 340, a spectroscope 350, a first lens 362, a second lens 364, a second polarization assembly 370, a camera 380, a third polarization assembly 385, a signal processor 20, and an optical shutter 390.

The first lens 362 may be disposed between the spectroscope 350 and the second polarization assembly 370. The spectroscope 350 may be disposed between the imaging optical system 340 and the first lens 362. The second lens 364 may be disposed between the optical shutter 390 and the third polarization assembly 385. The second polarization assembly 370 may be disposed between the first lens 362 and the optical shutter 390. The third polarization assembly 385 may be disposed between the second lens 364 and the camera 380.

The spectroscope 350 may be disposed at a position at which light is focused, for example. where an image is formed, by the imaging optical system 340. Three arbitrary diffraction orders may be applied to the spectroscope 350, and the spectroscope 350 may output incident light as three spectrums having different diffraction orders. Three spectrums having different diffraction orders, for example, −1st order, 0th order, and 1st order, may be output by a one-dimensional grating or a two-dimensional grating formed at the spectroscope 350. However, embodiments are not limited thereto. In an example embodiment, the spectroscope 350 may output four or more spectrums.

The second polarization assembly 370 may include a first polarizer 372 and a second polarizer 374. The first polarizer 372 and the second polarizer 374 of the second polarization assembly 370 may output polarized lights having a difference of 90°. A spectrum having a first diffraction order (−1st order) may be incident on the first polarizer 372. As an example, the first polarizer 372 may output first polarized light that is a 90° polarized light of the light incident from the first lens 362 to the optical shutter 390.

A spectrum having a second diffraction order (+1st order) may be incident on the second polarizer 374. As an example, the second polarizer 374 may output second polarized light that is a 0° polarized light of the light incident from the first lens 362 to the optical shutter 390.

A spectrum having a third diffraction order (0th order), which is a non-polarized light that has not passed through the polarizer, may be directly incident on the optical shutter 390.

A single spectrum, for example, a spectrum having 0th order or a plurality of spectrums, for example, a spectrum having −1st order and a spectrum having 1st order output from the optical shutter 390 may be focused on a specific point using the first lens 362 and the second lens 364. The third polarization assembly 385 may be disposed at a position at which a single spectrum, for example, a spectrum having 0th order or a plurality of spectrums, for example, a spectrum having −1st order and a spectrum having 1st order is focused.

Figure 9A:
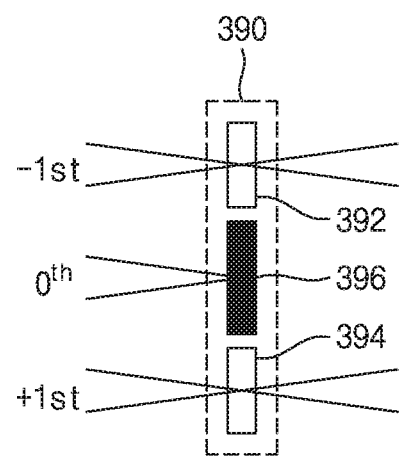
FIG. 9A illustrates that polarized spectrums are output using the optical shutter shown in FIG. 8.

FIG. 9A illustrates that polarized spectrums are output using the optical shutter 390 shown in FIG. 8.

Referring to FIGS. 8 and 9A, the optical shutter 390 may be disposed between the second polarization assembly 370 and the camera 380. The optical shutter 390 may include a plurality of sub-shutters, for example, three sub-shutters 392, 394, and 396.

The optical shutter 390 may selectively output or block a plurality of polarized lights having different diffraction orders using the three sub-shutters 392, 394, and 396. In addition, the optical shutter 390 may selectively output or block non-polarized light.

The first sub-shutter 392 of the optical shutter 390 may be disposed so as to correspond to the first polarizer 372. The first polarized light that is a 90° polarized light having a first diffraction order (−1st order) may be output or blocked by the first sub-shutter 392.

The second sub-shutter 394 of the optical shutter 390 may be disposed so as to correspond to the second polarizer 374. The second polarized light that is a 0° polarized light having a second diffraction order (+1st order) may be output or blocked by the second sub-shutter 394.

The third sub-shutter 396 of the optical shutter 390 may be disposed so as to correspond to a path of non-polarized light having a third diffraction order (0th order) that has not passed through the polarizer. The non-polarized light having the third diffraction order (0th order) may be output or blocked by the third sub-shutter 396.

The first sub-shutter 392 and the second sub-shutter 394 of the optical shutter 390 may be turned on, and the third sub-shutter 396 may be turned off. In this case, it is possible to analyze the wafer 10 using a polarization interference method, in the same manner as the description given with reference to FIGS. 1 to 3B.

When the first sub-shutter 392 is turned on, a first polarized light that is a 90° polarized light having a first diffraction order (−1st order) may be output to the first lens 362. When the second sub-shutter 394 is turned on, a second polarized light that is a 0° polarized light having a second diffraction order (+1st order) may be output to the second lens 364. When the third sub-shutter 396 is turned off, a spectrum having a third diffraction order (0th order) is not output.

Two perpendicularly polarized lights, for example, a 90° polarized light and a 0° polarized light may be focused through the second lens 364, and the two perpendicularly polarized lights, for example, a 90° polarized light and a 0° polarized light may be incident on the third polarization assembly 385. That is, the third polarization assembly 385 may output common polarized light such that the two perpendicularly polarized lights, for example, a 90° polarized light and a 0° polarized light interfere with each other. Interference between the two perpendicularly polarized lights, for example, a 90° polarized light and a 0° polarized light may be caused by the third polarization assembly 385. The third polarization assembly 385 may output the common polarized light to the camera 380. Common polarized light, for example, a 45° polarized light resulting from a combination of the first polarized light that is a 90° polarized light and the second polarized light that is a 0° polarized light may be incident on the camera 380.

The camera 380 may generate a test piece image having an interference pattern based on the common polarized light incident thereon, and may output the generated test piece image having the interference pattern to the signal processor 20. The signal processor 20 may analyze test piece images having interference patterns on the entire region of the wafer 10, and may output the result of analysis.

Figure 9B:
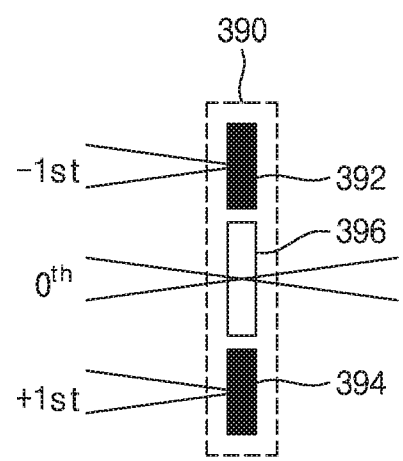
FIG. 9B illustrates that output of polarized spectrums is blocked using the optical shutter shown in FIG. 8.

FIG. 9B illustrates that output of polarized spectrums is blocked using the optical shutter 390 shown in FIG. 8.

Referring to FIGS. 8 and 9B, the first sub-shutter 392 and the second sub-shutter 394 of the optical shutter 390 may be turned off, and the third sub-shutter 396 may be turned on. In this case, it is possible to analyze the wafer 10 using the spectral reflectometry (SR) method or the spectral ellipsometry (SE) method.

When the first sub-shutter 392 is turned off, output of first polarized light that is a 90° polarized light having a first diffraction order (−1st order) is blocked. When the second sub-shutter 394 is turned off, output of second polarized light that is a 0° polarized light having a second diffraction order (+1st order) is blocked. It is possible to select output of first polarized light that is a 90° polarized light having a first diffraction order (−1st order) and second polarized light that is a 0° polarized light) having a second diffraction order (+1st order) from among the spectrums generated by the spectroscope 350 using the optical shutter 390. When the third sub-shutter 396 is turned on, a spectrum having a third diffraction order (0th order) may be output to the second lens 364.

The spectrum having the third diffraction order (0th order) may be incident on the third polarization assembly 385 through the second lens 364. Polarized light output from the third polarization assembly 385 may be incident on the camera 380. The camera 380 may generate a test piece image based on polarized light having a third diffraction order (0th order) incident thereon. The camera 380 may output the generated test piece image to the signal processor 20. The signal processor 20 may analyze test piece images having interference patterns on the entire region of the wafer 10, and may output the result of analysis.

In the wafer inspection apparatus 300 according to an example embodiment and a wafer inspection method using the same, it is possible to secure relatively high sensitivity and locality in defect detection through a single measurement, whereby it is possible to analyze whether patterns have been accurately formed on the wafer 10. In addition, it is possible to inspect the wafer 10 through a single measurement, thereby reducing inspection time. In addition, it is possible to change the inspection mode of the wafer inspection apparatus 300 such that the wafer 10 is inspected using the polarization interference method, the spectral reflectometry (SR) method, or the spectral ellipsometry (SE) method.

Figure 10A:
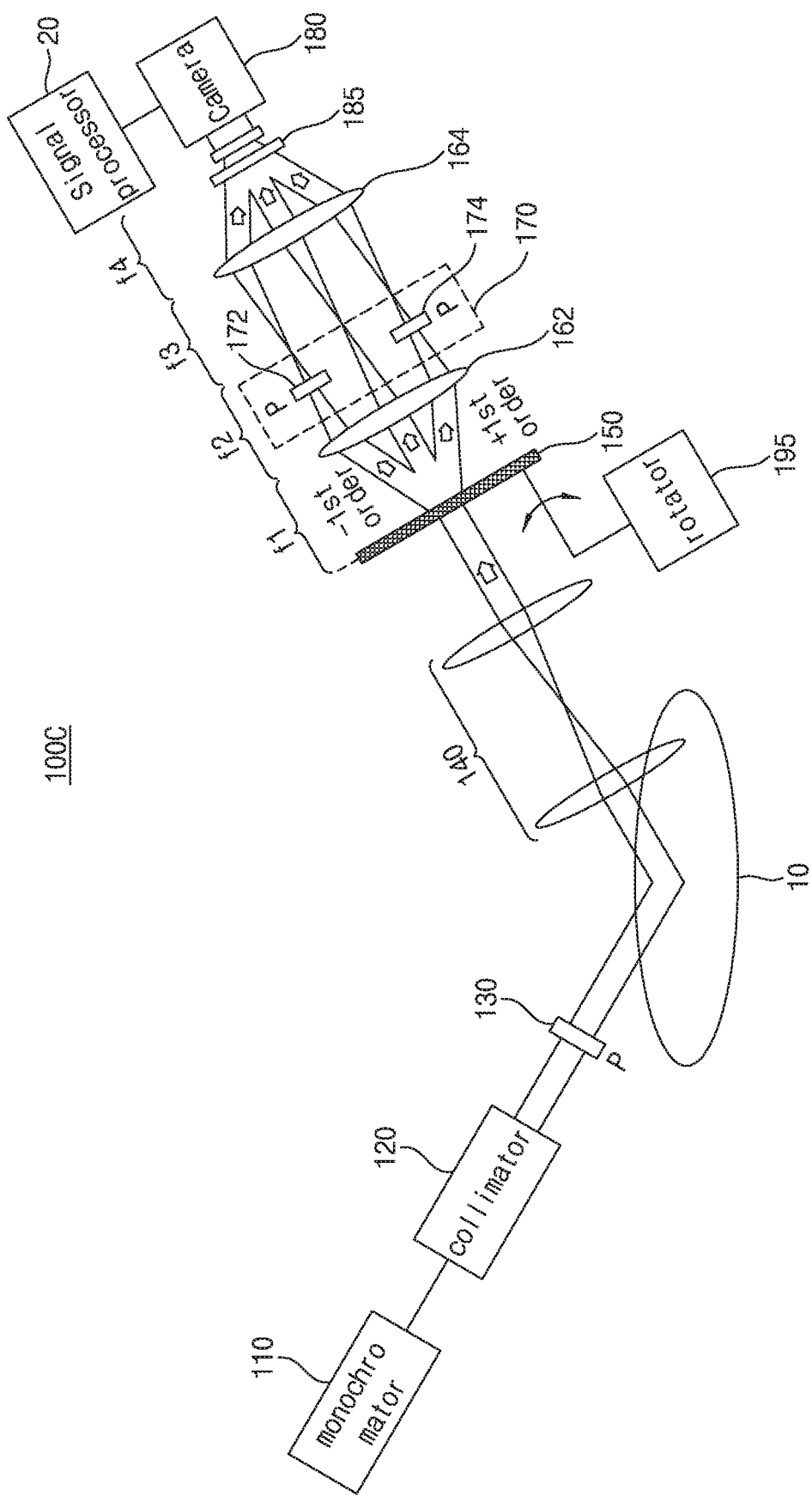
FIGS. 10A and 10B illustrate wafer inspection apparatuses in accordance with another example embodiment.

FIG. 10A illustrates a wafer inspection apparatus 100C in accordance with another example embodiment. In describing the wafer inspection apparatus 100C shown in FIG. 10A, a description of components identical to those of the wafer inspection apparatus 100A shown in FIG. 1 may be omitted.

Referring to FIG. 10A, the wafer inspection apparatus 100C may include a monochromator 110, a collimator 120, a first polarization assembly 130, an imaging optical system 140, a spectroscope 150, a first lens 162, a second lens 164, a second polarization assembly 170, a camera 180, a third polarization assembly 185, a signal processor 20, and a rotator 195. The second polarization assembly 170 may include a first polarizer 172 and a second polarizer 174.

The rotator 195 may be physically connected to the spectroscope 150, and may rotate to change the position of the spectroscope 150.

Figure 10B:
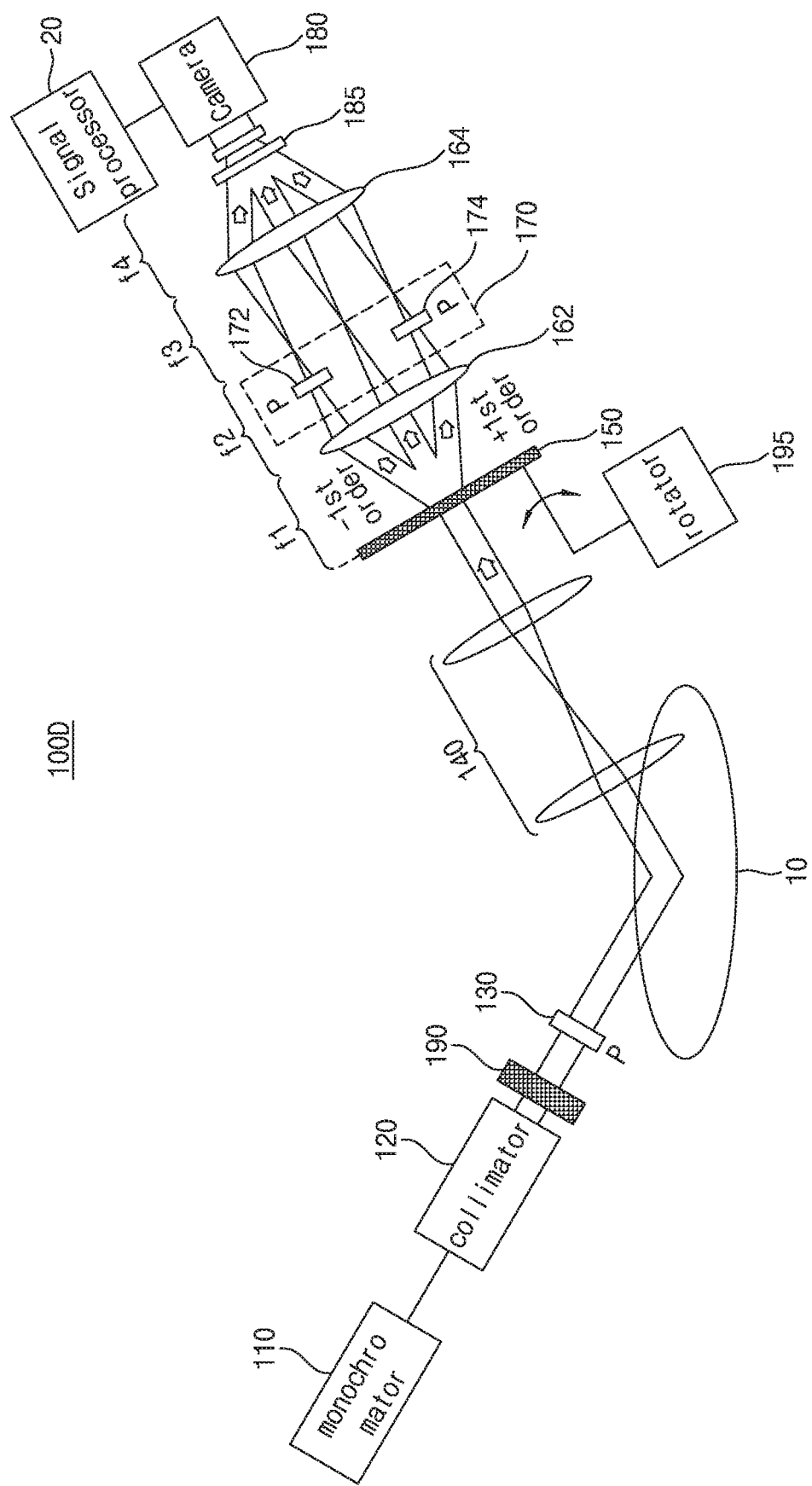

FIG. 10B illustrates a wafer inspection apparatus 100D in accordance with another example embodiment. In describing the wafer inspection apparatus 100D shown in FIG. 10B, a description of components identical to those of the wafer inspection apparatus 100A shown in FIG. 1 may be omitted.

Referring to FIG. 10B, a reference light signal generator 190, which is configured to provide properties of source light radiated to the wafer 10 to a signal processor 20, may include a beam splitter configured to split the source light. The reference light signal generator 190 may be disposed between a collimator 120 and a first polarization assembly 130. However, embodiments are not limited thereto. In an example embodiment, the reference light signal generator 190 may be disposed between the first polarization assembly 130 and the wafer 10.

The reference light signal generator 190 may generate a reference light signal in order to improve accuracy in analysis when the signal processor 20 analyzes a test piece image having an interference pattern. As an example, the reference light signal generator 190 may split source light before the source light is radiated to the wafer 10, and may analyze reference light split from the source light in order to generate a reference light signal. The reference light signal may be output to the signal processor 20. The signal processor 20 may analyze test piece images having interference patterns on the entire region of the wafer 10 based on the reference light signal, and may output the result of analysis.

Figure 11A:
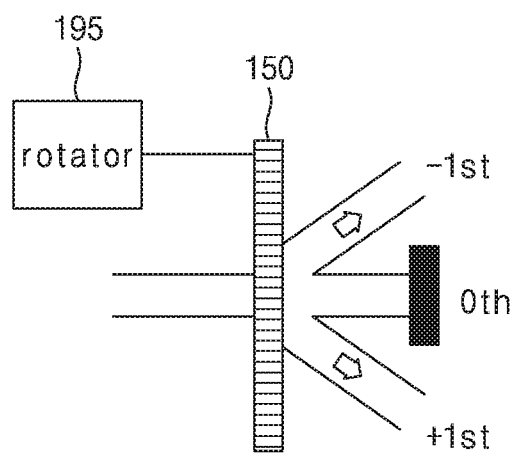
FIG. 11A illustrates the spectroscope that is inserted into an optical path to operate the wafer inspection apparatus in a polarization interference mode.

FIG. 11A illustrates that the spectroscope 150 is inserted into an optical path to operate the wafer inspection apparatus 100C or 100D in a polarization interference mode.

Referring to FIGS. 10A, 10B, and 11A, the rotator 195 may locate the spectroscope 150 between the imaging optical system 140 and the first lens 162. For example, the rotator 195 may locate the spectroscope 150 on the optical path. In the case in which the spectroscope 150 is located on the optical path, it is possible to analyze the wafer 10 using the polarization interference method, in the same manner as the description given with reference to FIGS. 1 to 3B.

When the spectroscope 150 is located on the optical path, first polarized light that is a 90° polarized light having a first diffraction order (−1st order) may be output to the second lens 364. In addition, second polarized light that is a 0° polarized light having a second diffraction order (+1st order) may be output to the second lens 364.

Two perpendicularly polarized lights, for example, a 90° polarized light and a 0° polarized light, may be focused through the second lens 164. The two perpendicularly polarized lights, for example, a 90° polarized light and a 0° polarized light output from the second lens 164 may be incident on the third polarization assembly 185. The third polarization assembly 385 may output common polarized light, for example, 45° polarized light, to the camera 180 such that the two perpendicularly polarized lights, for example, a 90° polarized light and a 0° polarized light interfere with each other. That is, common polarized light, for example, a 45° polarized light resulting from a combination of the first polarized light that is a 90° polarized light and the second polarized light that is a 0° polarized light may be incident on the camera 180.

The camera 180 may generate a test piece image having an interference pattern based on the common polarized light incident thereon. The camera 180 may output the generated test piece image having the interference pattern to the signal processor 20. The signal processor 20 may analyze test piece images having interference patterns on the entire region of the wafer 10, and may output the result of analysis.

Figure 11B:
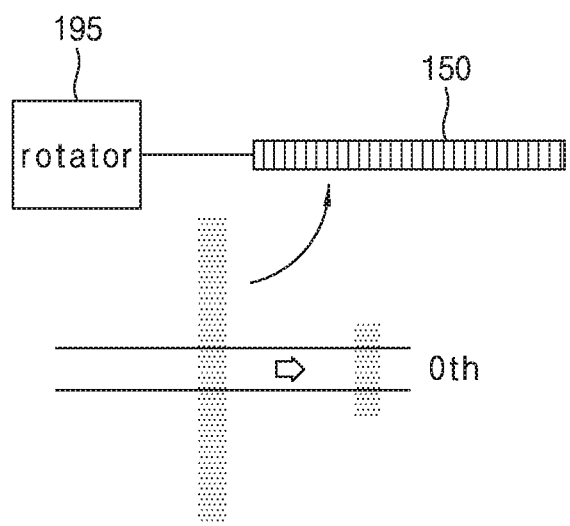
FIG. 11B illustrates the spectroscope that is removed from the optical path to operate the wafer inspection apparatus in a spectral reflectometry mode.

FIG. 11B illustrates that the spectroscope 150 is removed from the optical path to operate the wafer inspection apparatus 100C or 100D in a spectral reflectometry mode.

Referring to FIGS. 10A, 10B, and 11B, the rotator 195 may remove the spectroscope 150 located between the imaging optical system 140 and the first lens 162. For example, the rotator 195 may remove the spectroscope 150 from the optical path. In the case in which the spectroscope 150 is removed from the optical path, light is incident on the first lens 162 and the second lens 164 without spectroscopy. In this case, it is possible to analyze the wafer 10 using the spectral reflectometry (SR) method or the spectral ellipsometry (SE) method.

In the case in which the spectroscope 150 is removed from the optical path, spectroscopy may not be performed, and therefore beams having no diffraction order may be incident on the third polarization assembly 185 via the second lens 164. The third polarization assembly 185 may output polarized light having no diffraction order to the camera 180. The camera 180 may generate a test piece image of the wafer 10 based on the polarized light incident thereon. The camera 180 may output the generated test piece image of the wafer 10 to the signal processor 20. The signal processor 20 may analyze test piece images having interference patterns on the entire region of the wafer 10, and may output the result of analysis.

The rotator 195 may also be applied to the wafer inspection apparatus 100B shown in FIG. 4. In addition, the rotator 195 may also be applied to the wafer inspection apparatus 200 shown in FIG. 5. In addition, the rotator 195 may also be applied to the wafer inspection apparatus 200-1 shown in FIG. 7. In addition, the rotator 195 may also be applied to the wafer inspection apparatus 300 shown in FIG. 8.

In the wafer inspection apparatus according to example embodiments and a wafer inspection method using the same, it is possible to secure relatively high sensitivity and locality in defect detection through a single measurement, whereby it is possible to analyze whether patterns have been accurately formed on the wafer. In addition, it is possible to inspect the wafer through a single measurement, thereby reducing inspection time. In addition, it is possible to change the inspection mode of the wafer inspection apparatus such that the wafer is inspected using the polarization interference method, the spectral reflectometry (SR) method, or the spectral ellipsometry (SE) method.

As is apparent from the above description, a wafer inspection apparatus and wafer inspection method according to example embodiments may acquire a phase difference image between different polarized lights through a single measurement, whereby it is possible to inspect a wafer with improved sensitivity without reduction in speed.

The wafer inspection apparatus and the wafer inspection method according to example embodiments may acquire a phase difference image between different polarized lights through a single measurement, whereby it is possible to improve sensitivity in defect detection.

The wafer inspection apparatus and the wafer inspection method according to example embodiments may acquire a phase difference image between different polarized lights through a single measurement, whereby it is possible to secure locality in defect detection.

The wafer inspection apparatus and the wafer inspection method according to example embodiments may change the inspection mode of the wafer inspection apparatus, whereby it is possible to inspect the wafer using a polarization interference method, a spectral reflectometry (SR) method, or a spectral ellipsometry (SE) method.

While example embodiments have been described with reference to the figures, it will be understood by those of ordinary skill in the art that various changes in form and details may be made therein without departing from the spirit and scope of the present disclosure as defined by the following claim.

What is claimed is:

1. A wafer inspection apparatus comprising:
a monochromator configured to extract monochromatic light from light received from a light source;
a collimator configured to output the monochromatic light received from the monochromator as parallel light;
a first polarization assembly configured to polarize the parallel light received from the collimator and to radiate the polarized light to a wafer;
an imaging optical system configured to condense light reflected from the wafer;
a spectroscope configured to split the condensed light output from the imaging optical system into a plurality of spectrums having different diffraction orders;
a first lens configured to condense the plurality of spectrums having different diffraction orders;
a second polarization assembly configured to output the plurality of spectrums having different diffraction orders as a plurality of polarized lights having different diffraction orders and a difference of 90°;
a second lens configured to condense the plurality of polarized lights having the different diffraction orders and the difference of 90°;
a third polarization assembly configured to output common polarized light based on the plurality of polarized lights having the different diffraction orders interfering with each other;
a camera configured to generate a phase difference image based on the common polarized light; and
a signal processor configured to analyze the phase difference image.

2. The wafer inspection apparatus of claim 1, further comprising a reference light signal generator configured to split light radiated to the wafer, acquire reference light, analyze the reference light, and generate a reference light signal.

3. The wafer inspection apparatus of claim 2, wherein the signal processor is further configured to analyze the phase difference image based on the reference light signal.

4. The wafer inspection apparatus of claim 1, wherein the spectroscope comprises a one-dimensional grating uniformly disposed.

5. The wafer inspection apparatus of claim 1, wherein the spectroscope comprises a two-dimensional grating uniformly disposed.

6. The wafer inspection apparatus of claim 1, wherein the spectroscope is further configured to split incident light into a first spectrum having a first diffraction order and a second spectrum having a second diffraction order.

7. The wafer inspection apparatus of claim 6, wherein the second polarization assembly comprises a first polarizer configured to output first polarized light and a second polarizer configured to output second polarized light that has a difference of 90° with respect to the first polarized light,
wherein the first polarizer is further configured to polarize and output the first spectrum having the first diffraction order by 90°, and
wherein the second polarizer is further configured to polarize and output the second spectrum having the second diffraction order by 0°.

8. The wafer inspection apparatus of claim 1, wherein the spectroscope is further configured to split incident light into a first spectrum having a first diffraction order, a second spectrum having a second diffraction order, a third spectrum having a third diffraction order, and a fourth spectrum having a fourth diffraction order.

9. The wafer inspection apparatus of claim 8, wherein the second polarization assembly comprises:
a first polarizer configured to output a first polarized light and a second polarizer configured to output a second polarized light that has a difference of 90° with respect to the first polarized light; and
a third polarizer configured to output a third polarized light and a fourth polarizer configured to output a fourth polarized light that has a difference of 90° with respect to the third polarized light,
wherein the first polarizer is further configured to polarize and output the first spectrum having the first diffraction order by 90°,
wherein the second polarizer is further configured to polarize and output the second spectrum having the second diffraction order by 0°,
wherein the third polarizer is further configured to polarize and output the third spectrum having the third diffraction order by 45°, and
wherein the fourth polarizer is further configured to polarize and output the fourth spectrum having the fourth diffraction order by 135°.

10. A wafer inspection apparatus comprising:
a monochromator configured to extract monochromatic light from light received from a light source;
a collimator configured to output the monochromatic light received from the monochromator as parallel light;
a first polarization assembly configured to polarize the parallel light received from the collimator and to radiate the polarized light to a wafer;
an imaging optical system configured to condense light reflected from the wafer;
a spectroscope configured to split the condensed light output from the imaging optical system into a plurality of spectrums having different diffraction orders;
a first lens configured to condense the plurality of spectrums having the different diffraction orders;
a second polarization assembly configured to output two spectrums, among the plurality of spectrums having the different diffraction orders, as a plurality of polarized lights having different diffraction orders and a difference of 90°;
an optical shutter configured to selectively output the plurality of polarized lights having different diffraction orders and the difference of 90° and non-polarized light;
a second lens configured to condense the plurality of polarized lights output from the optical shutter;
a third polarization assembly configured to output common polarized light based on the plurality of polarized lights interfering with each other;
a camera configured to generate a phase difference image based on the common polarized light; and
a signal processor configured to analyze the phase difference image.

11. The wafer inspection apparatus of claim 10, wherein the spectroscope comprises a one-dimensional grating uniformly disposed.

12. The wafer inspection apparatus of claim 10, wherein the spectroscope comprises a two-dimensional grating uniformly disposed.

13. The wafer inspection apparatus of claim 10, wherein the spectroscope is further configured to split incident light into a first spectrum having a first diffraction order, a second spectrum having a second diffraction order, and a third spectrum having a third diffraction order.

14. The wafer inspection apparatus of claim 13, wherein the second polarization assembly comprises a first polarizer configured to output a first polarized light and a second polarizer configured to output second polarized light that has a difference of 90° with respect to the first polarized light,
wherein the first polarizer is further configured to polarize and output the first spectrum having the first diffraction order by 90°, and
wherein the second polarizer is further configured to polarize and output the second spectrum having the second diffraction order by 0°.

15. The wafer inspection apparatus of claim 14, wherein the third spectrum having the third diffraction order is incident on the optical shutter as non-polarized light.

16. The wafer inspection apparatus of claim 15, wherein the optical shutter comprises a first sub-shutter, a second sub-shutter, and a third sub-shutter,
wherein the first sub-shutter is configured to output or block 90° polarized light having a first diffraction order incident from the first polarizer,
wherein the second sub-shutter is configured to output or block 0° polarized light having a second diffraction order incident from the second polarizer, and
wherein the third sub-shutter is configured to output or block the non-polarized light having the third diffraction order.

17. The wafer inspection apparatus of claim 15, wherein the second lens is further configured to condense 90° polarized light having the first diffraction order and 0° polarized light having the second diffraction order as the common polarized light.

18. A wafer inspection apparatus comprising:
a monochromator configured to extract monochromatic light from light received from a light source;
a collimator configured to output the monochromatic light received from the monochromator as parallel light;
a first polarization assembly configured to polarize the parallel light received from the collimator and to radiate the polarized light to a wafer;
an imaging optical system configured to condense light reflected from a test piece of the wafer;
a spectroscope configured to split the condensed light output from the imaging optical system into a plurality of spectrums having different diffraction orders;
a first lens configured to condense the plurality of spectrums having different diffraction orders;
a rotator configured to change a position of the spectroscope;
a second polarization assembly configured to output the plurality of spectrums having different diffraction orders as a plurality of polarized lights having different diffraction orders and a difference of 90°;
a second lens configured to condense the plurality of polarized lights having different diffraction orders and the difference of 90°;
a third polarization assembly configured to output common polarized light based on the plurality of polarized lights having different diffraction orders interfering with each other;
a camera configured to generate a phase difference image based on the common polarized light; and
a signal processor configured to analyze the phase difference image.

19. The wafer inspection apparatus of claim 18, wherein the rotator is configured to locate the spectroscope on an optical path between the imaging optical system and the first lens.

20. The wafer inspection apparatus of claim 19, wherein the rotator is further configured to remove the spectroscope from the optical path.

* * * * *